(12) United States Patent
Sugimoto

(10) Patent No.: US 9,496,826 B2
(45) Date of Patent: Nov. 15, 2016

(54) TRANSIMPEDANCE AMPLIFIER

(71) Applicant: SUMITOMO ELECTRIC INDUSTRIES, LTD., Osaka-shi, Osaka (JP)

(72) Inventor: Yoshiyuki Sugimoto, Yokohama (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 14/663,385

(22) Filed: Mar. 19, 2015

(65) Prior Publication Data
US 2015/0270808 A1     Sep. 24, 2015

(30) Foreign Application Priority Data
Mar. 24, 2014   (JP) ................. P2014-060349

(51) Int. Cl.
| | |
|---|---|
| H03F 1/34 | (2006.01) |
| H03F 1/02 | (2006.01) |
| H03F 3/08 | (2006.01) |
| H03F 1/08 | (2006.01) |
| H03F 3/45 | (2006.01) |

(52) U.S. Cl.
CPC ............ *H03F 1/0205* (2013.01); *H03F 1/083* (2013.01); *H03F 3/08* (2013.01); *H03F 3/087* (2013.01); *H03F 3/45475* (2013.01); *H03F 2200/144* (2013.01); *H03F 2200/171* (2013.01)

(58) Field of Classification Search
CPC ..................................... H03F 1/34; H03F 3/08
USPC .................................................. 330/294, 308
See application file for complete search history.

(56) References Cited

U.S. PATENT DOCUMENTS

| | | | |
|---|---|---|---|
| 7,689,180 B2 * | 3/2010 | Grundlingh | H03F 1/34 330/149 |
| 8,395,444 B2 * | 3/2013 | Hara | H03G 3/3084 330/141 |

FOREIGN PATENT DOCUMENTS

| | | |
|---|---|---|
| JP | 3284506 | 5/2002 |
| JP | 2010-213128 | 9/2010 |
| JP | 2012-010107 | 1/2012 |
| JP | 2012-060436 | 3/2012 |

* cited by examiner

*Primary Examiner* — Henry Choe
(74) *Attorney, Agent, or Firm* — Smith, Gambrell & Russell, LLP.

(57) ABSTRACT

A TIA converts an input current into a output voltage. The TIA includes a feedback circuit that controls a bypass current to be extracted from the input current. The feedback circuit includes: a filter that passes low frequency components of the output voltage; a voltage shifter which includes a current source and converts an output signal of the filter into a first shift signal with a time constant; a voltage shifter which includes a current source, and converts a first threshold reference into a second shift signal with another time constant; a comparator which generates a control signal to control the bypass circuit by comparing the first shift signal with the second shift signal; and a comparator which controls the time constant by comparing the control signal with a second threshold reference.

3 Claims, 12 Drawing Sheets

TRANSIMPEDANCE AMPLIFIER

TECHNICAL FIELD

The present invention relates to a transimpedance amplifier used in an optical receiver.

BACKGROUND

In a 10G-EPON (10 Gigabit Ethernet Passive Optical Network) which is a next generation system of optical access systems such as FTTx (Fiber To The x) system or the like, a receiver part of Optical Line Terminal (OLT) in a station building needs to receive burst mode signals with various strengths sent from a plurality of homes. Therefore, a TIA (Trans-Impedance Amplifier) configuring the receiver part of the OLT is required to have high speed responsiveness to the burst mode signals. Furthermore, since a photo detector of the receiver part of the OLT is required to have high receiver sensitivity, an APD (Avalanche PhotoDiode) is used as such a photo detector, for instance. Conventionally, there is a TIA including a control circuit to keep an average of outputs from a TIA to be constant (see Japanese Patent No. 3284506, for example). In such a TIA including the control circuit, a circuit such as a low-pass filter configured by a resistor and a capacitor is used.

CITATION LIST

[Patent Literature 1] Japanese Patent No. 3284506
[Patent Literature 2] Japanese Patent Application Laid-Open No. 2010-213128
[Patent Literature 3] Japanese Patent Application Laid-Open No. 2012-060436
[Patent Literature 4] Japanese Patent Application Laid-Open No. 2012-010107

Here, in the TIA, suitable response time of the control circuit depends on a reception state of burst signals. That is, in receiving the burst signals, a larger time constant is preferable, because it makes the response time longer so as to surpress signal errors against consecutive identical digits (CIDs) within the burst signals. On the other hand, in an interval from an end of one burst signal to a start of another burst signal, a shorter response time is preferable so as for the control circuit to quickly respond to a burst signal coming just after the interval, and to improve communication efficiency by reducing a time of the interval.

In order to change the response time depending on the reception state of the burst signals, a configuration capable of at least increasing the time constant is needed with respect to the longer response time. Therefore, conventionally, a value of the resistor or the capacitor is set large to increase the time constant of the low-pass filter. Such a large resistor or a large capacitor, however, may prevent downsizing of the TIA.

The present invention has been made to solve the above-described problems, and an object of the present invention is to provide a downsized transimpedance amplifier with an widely adjustable response time.

SUMMARY

The present invention relates to a transimpedance amplifier as one aspect thereof. The transimpedance amplifier is a transimpedance amplifier comprising: a core unit configured to convert a current signal to a output voltage; a bypass circuit configured to generate the current signal by extracting a bypass current from an input current; and a feedback circuit configured to adjust the bypass current based on the output voltage. The feedback circuit includes a filter configured to generates low frequency components of the output voltage; a first shifter configured to generate a first shift signal from the low frequency components with a time constant; a second shifter configured to generate a second from a first threshold reference; a first comparator configured to control the bypass current by comparing the first shift signal and the second shift signal; and a second comparator configured to control the time constant and the another time constant by comparing an output of the first comparator with a second threshold reference.

DETAILED DESCRIPTION

Figure 1A:
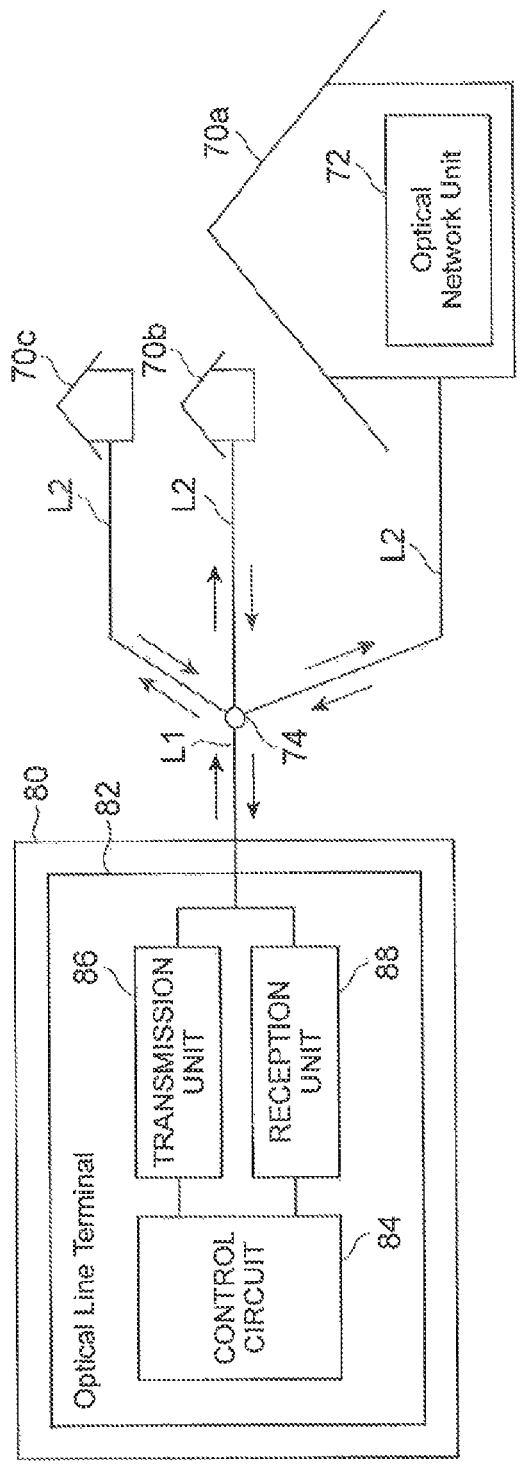
FIG. 1A is a block diagram illustrating an example of a PON system.

Description of an Embodiment of the Claimed Invention

First, contents of an embodiment of the claimed invention will be listed and described.

The present invention relates to a transimpedance amplifier as one aspect thereof. The transimpedance amplifier is a transimpedance amplifier that converts an input current into an output voltage, comprising: a core unit configured to convert a current signal to the output voltage; a bypass circuit configured to generate the current signal by extracting a bypass current from the input current; and a feedback circuit configured to adjust the bypass current based on the output voltage, wherein the feedback circuit includes a filter configured to generate low frequency components of the output voltage; a first shifter configured to generate a first shift signal from the low frequency components with a time constant; a second shifter configured to generate a second shift signal from a first threshold reference with another time constant; a first comparator configured to control the bypass current by comparing the first shift signal with the second shift signal; and a second comparator configured to control the time constant and the another time constant by comparing an output of the first comparator with a second threshold reference.

In this transimpedance amplifier, the first comparator outputs the first control signal for adjusting the amount of the bypass current on the basis of the first shift signal for which the voltage is increased or reduced according to the output signal of the filter, and the second shift signal for which the voltage is increased or reduced according to the first threshold reference. Therefore, by setting the first threshold reference so as to start extraction of the bypass current by the bypass circuit in the case that the first shift signal becomes a predetermined value for example, the extraction of the current is automatically started according to the output signal of the filter, and a gain is controlled. Also, the second comparator control the time constant and the another time constant by comparing an output of the first comparator with a second threshold reference. Therefore, the time constant, that is, the response time, of the feedback circuit can be appropriately adjusted by setting of the second threshold reference. Since the response time of the feedback circuit can be adjusted independent of values of a resistor and a capacitor, enlargement of the transimpedance amplifier can be suppressed. From the above, according to the present invention, miniaturization of the transimpedance amplifier can be realized while appropriately adjusting the response time of the feedback circuit.

Also, in the transimpedance amplifier, the first shifter may include a series circuit of a first diode and a first parallel circuit, the first diode being put between the filter and the first comparator, the first parallel circuit including a first capacitor and a first current source connected in parallel to the first capacitor, the first current source generating a discharging current for the first capacitor, and the second shifter may include a series circuit of a second diode and a second parallel circuit, the second diode being put between the fast threshold reference and the first comparator, the second parallel circuit including a second capacitor and a second current source connected in parallel to the second capacitor, the second current source generating another discharging current for the second capacitor. Further, the first comparator generates a first control signal to control the bypass circuit and the second comparator, and adjusts the bypass current by changing the first control signal. Further, the second comparator generates a second signal to control the first current source and the second current source. Since the capacitor and the current source are connected in parallel, a discharge current from the capacitor can be increased or reduced, and the response time of the feedback circuit can be appropriately adjusted. Also, by increasing or reducing the respective current amounts of the first current source and the second current source, an operating current source can be stopped (or, the current amount can be made smaller than a predetermined value), or a stopped current source can be operated (or, the current amount can be made larger than the predetermined value). In the state that the current source is stopped (or, the state that the current amount is smaller than the predetermined value. Sometimes it is described as an "OFF state" hereinafter), compared to the state that the current source is operated (or, the state that the current amount is larger than the predetermined value. Sometimes it is described as an "ON state" hereinafter), a flowing current is reduced, and the response time of the feedback circuit is prolonged. In this way, by switching an operating state of a power supply of the current source, the response time of the feedback circuit can be appropriately adjusted.

Also, in the transimpedance amplifier, the time constant of the first shifter may become shorter by increasing the discharging current of the first current source when the first control signal becomes higher than the second threshold reference. Further, the time constant of the first shifter may become longer by decreasing the discharging current of the first current source when the first control signal becomes lower than the second threshold reference. Thus, in the state that the power supply of the first current source is operated (ON state), the discharge current from the capacitor can be increased and the response time of the feedback circuit can be shortened. Also, in the state that the power supply of the first current source is stopped (OFF state), the discharge current from the capacitor can be reduced and the response time of the feedback circuit can be prolonged. That is, by switching the operating state of the current source, the response time of the feedback circuit can be appropriately adjusted.

Also, in the transimpedance amplifier, the second threshold reference may include a first threshold and a second threshold, the first threshold being lower than the second threshold. Further, the time constant of the first shifter becomes shorter by increasing the discharging current of the first current source when the first controls signal becomes higher than the second threshold. Further, the time constant of the first shifter becomes longer by decreasing the discharging current of the first current source when the first control signal becomes lower than the first threshold. By turning the second comparator to the hysteresis comparator and setting thresholds of different values as thresholds based on the second threshold reference, frequent alternate transition to the respective states at the boundary of increasing or reducing the output current of the first current source can be suppressed. As a result, instability of a circuit operation can be suppressed.

DETAILS OF THE EMBODIMENT OF THE CLAIMED INVENTION

First, as one example of a communication system according to the embodiment of the present invention, a PON (Passive Optical Network) system will be described. FIG. 1A is a block diagram of the PON system. An Optical Line Terminals (OLTs) 82 inside a station building 80 is connected with individual Optical Network Units (ONUs) 72 inside a plurality of homes 70a-70c, for example, through communication lines L1 and L2 which are optical fibers. The OLT 82 is connected with an optical splitter 74 through one communication line L1. Further, the optical splitter 74 is connected with the individual ONUs 72 through the respective communication lines L2. The optical splitter 74 distributes an optical signal output from the OLT 82 to the respective communication lines L2, and contrarily relays optical signals from the ONUs to the communication line L1. The communication lines L1 and L2 propagate optical signals bidirectionally between the OLT 82 and the respective ONUs 72. The OLT 82 includes a control circuit 84, a transmission unit (transmitter) 86 and a reception unit (receiver) 88. The transmission unit 86 transmits optical signals into the communication line L1. The reception unit 88 receives optical signals from the communication line L1. The control circuit 84 controls the transmission unit 86 and reception unit 88. The wavelength of optical signals transmitted from the transmission unit 86 and the wavelength of optical signals received in the reception unit 88 are different from each other.

Figure 1B:
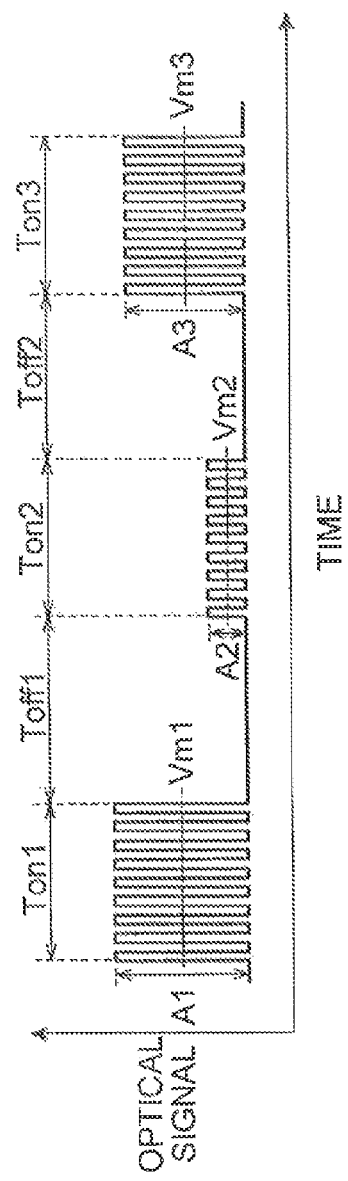
FIG. 1B shows waveforms of an optical signal received in a receiver of the PON system.

FIG. 1B shows waveforms illustrating transition of optical signals input to a photo detector 89 (see FIG. 2) of the reception unit 88. During a period Ton1, the optical signal from the ONU 72 of the home 70*a* is input. No optical signal is input during a period Toff1, and the optical signal from the ONU (not shown in the figure) of the home 70*b* is input in a period Ton2. Further, no optical signal is input during a period Toff2, and the optical signal from the ONU (not shown in the figure) of the home 70*c* is input in a period Ton3. Amplitudes of output signals output from the individual ONU 72 and optical losses of the individual communication lines L2 are respectively different from others. Therefore, amplitudes of the optical signals in the periods Ton1, Ton2 and Ton3 (input signal periods) become different from others like amplitudes A1, A2 and A3 respectively. In this way, the reception unit 88 for the PON receives the optical signals with different amplitude from others non-periodically. Also, in the periods Toff1 and Toff2 (interval periods) for the reception unit 88 prepares a standby state for the next optical signal. In an amplifier circuit used in the reception unit 88, since the amplitudes of the optical signals to be input are different, a feedback circuit is used.

Figure 2:
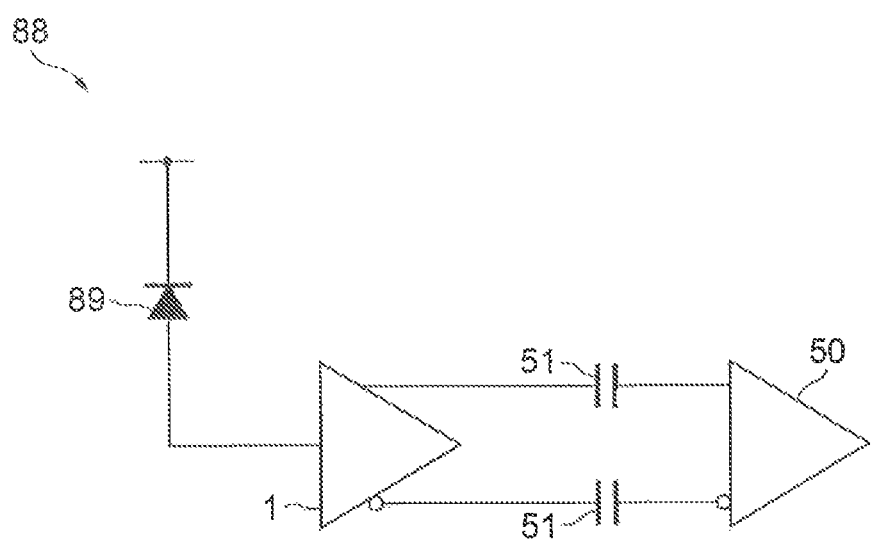
FIG. 2 is a diagram illustrating an example of a configuration of the reception unit in FIG. 1.

Next, a configuration of the reception unit 88 included in the OLT 82 will be described. FIG. 2 is a diagram illustrating an example of a configuration of the reception unit 88 in FIG. 1A. The reception unit 88 is a 10G-EPON (10 Gigabit Ethernet Passive Optical Network) receiver for example. The reception unit 88 includes a photo detector 89, a transimpedance amplifier (TIA: Trans-Impedance Amplifier) 1 and a limiting amplifier (LIA: Limiting Amplifier) 50.

The photo detector 89 converts optical signals to electric signals, current signals more specifically. An avalanche photodiode (APD: Avalanche Photo Diode) is used as a photo detector, for example. The current signals output by the photo detector 89 is input to the TIA 1.

The TIA 1 is an IC (Integrated Circuit) that converts an input current to a voltage signal and outputs an amplified voltage signal. The gain of the TIA 1 is set to a high value when strength of the input current is small, and set to a low value when the strength of the input current is large. Differential signals (voltage signals) amplified by the TIA 1 are input to the LIA 50. Also, the TIA 1 and the LIA 50 are connected to each other through a capacitor 51. The capacitor 51 configures AC coupling appropriate for high-speed responses to burst signals. Therefore, a capacitance of the capacitor 51 is set to a value smaller than that of a capacitor used in a receiver that receives mainly continuous signals for a trunk line system or the like is used. Details of the TIA 1 will be described later.

The LIA 50 is an IC that amplifies the voltage signals with various strengths to the voltage signals with a fixed amplitude. The LIA 50 equalizes respective DC levels of positive-phase signal and negative-phase of the differential signals. A CDR (Clock and Data Recovery) (not shown in the figure) generates a clock signal with small jitters from the output signal of the LIA 50. Then, data decision processing is performed by the clock signal.

Figure 3:
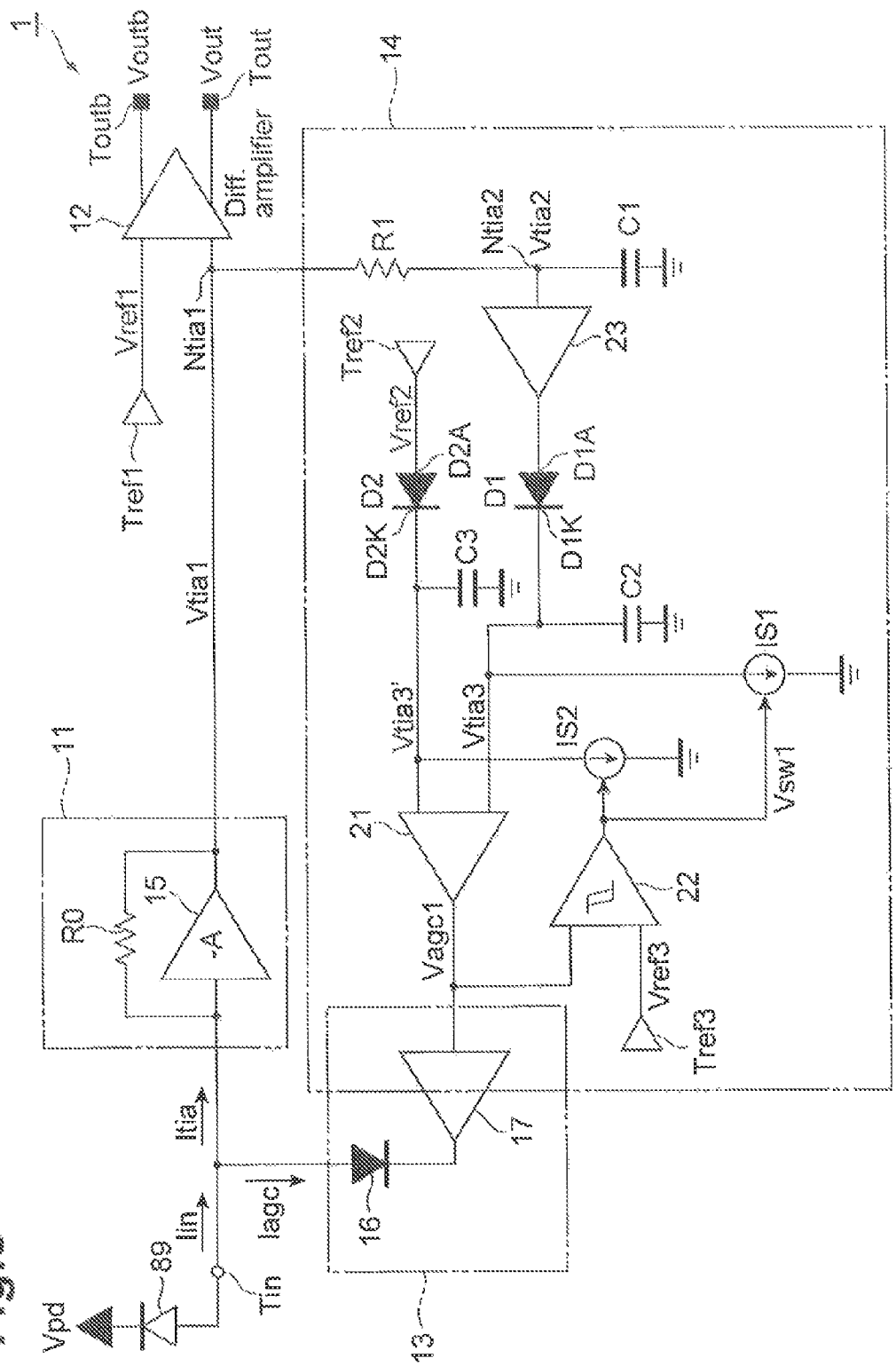
FIG. 3 is a circuit diagram illustrating a transimpedance amplifier according to the present embodiment.

Next, the TIA 1 will be described in detail. FIG. 3 is a circuit diagram illustrating the TIA 1 according to the present embodiment. As illustrated in FIG. 3, the TIA 1 includes a TIA core unit 11 (core unit), a differential amplifier 12 (amplifier unit), a bypass circuit 13, and a feedback circuit 14. An anode of the photo detector 89 is connected with an input terminal Tin. Also, a cathode of the photo detector 89 is connected to a power supply Vpd. An input signal (input current) Iin input to the input terminal Tin is split to a current signal Itia of the TIA core unit 11 and a bypass current Iagc of the bypass circuit 13.

The TIA core unit 11 includes an amplifier 15 and a feedback resistor R0, converts the current signal to the voltage signal and outputs the voltage signal. The TIA core unit 11 amplifies the input current Itia, and outputs an output signal (output voltage) Vtia1 to a node Ntia1.

The differential amplifier 12 amplifies Vtia1-Vref1 which is a difference between the output voltage Vtia1 output from the TIA core unit 11 and a reference voltage Vref1 applied to a reference voltage terminal Tref1. For example, in the differential amplifier 12, when the output voltage Vtia1 is equal to the reference voltage Vref1, output voltages Vout and Voutb become equal to each other. The voltage is defined as a center voltage Vcenter. When the output voltage Vtia1 is larger than the reference voltage Vref1, the differential amplifier 12 outputs the output voltage Vout larger than the center voltage Vcenter to an output terminal Tout, and outputs the output voltage Voutb smaller than the center voltage Vcenter to an output terminal Toutb. Also, when the output voltage Vtia1 is smaller than the reference voltage Vref1, the differential amplifier 12 outputs the output voltage Vout smaller than the center voltage Vcenter to the output terminal Tout, and outputs the output voltage Voutb larger than the center voltage Vcenter to the output terminal Toutb. The output voltages Vout and Voutb are complementary signals whose phases are different from each other by 180 degrees.

The bypass circuit 13 extracts the bypass current Iagc from the input current Iin to generate the current signal Itia according to a control signal from the feedback circuit 14. The bypass circuit 13 includes a diode 16 and a buffer 17. An anode of the diode 16 is connected to the input terminal Tin, and a cathode of the diode is connected to the buffer 17. A control signal Vagc1 (details will be described later) output from the feedback circuit 14 is input to the buffer 17. When a control signal Vagc1 is lowered, the bypass circuit 13 lowers a potential between the anode of the diode 16 and the buffer 17, and increases a bypass current Iagc.

In this way, the bypass circuit 13 bypasses the bypass current Iagc from the input current Iin according to the control signal Vagc1. By the bypassing mechanism described above, a time average of the current signal Itia input to the TIA core unit 11 is reduced and the gain of the TIA 1 is reduced as a result. That is, the bypass circuit 13 is controlled by the feedback circuit 14 so as to increase the bypass current Iagc and reduce the time average of the input current Itia input to the TIA core unit 11 when the output voltage Vtia1 becomes large.

Figure 4:
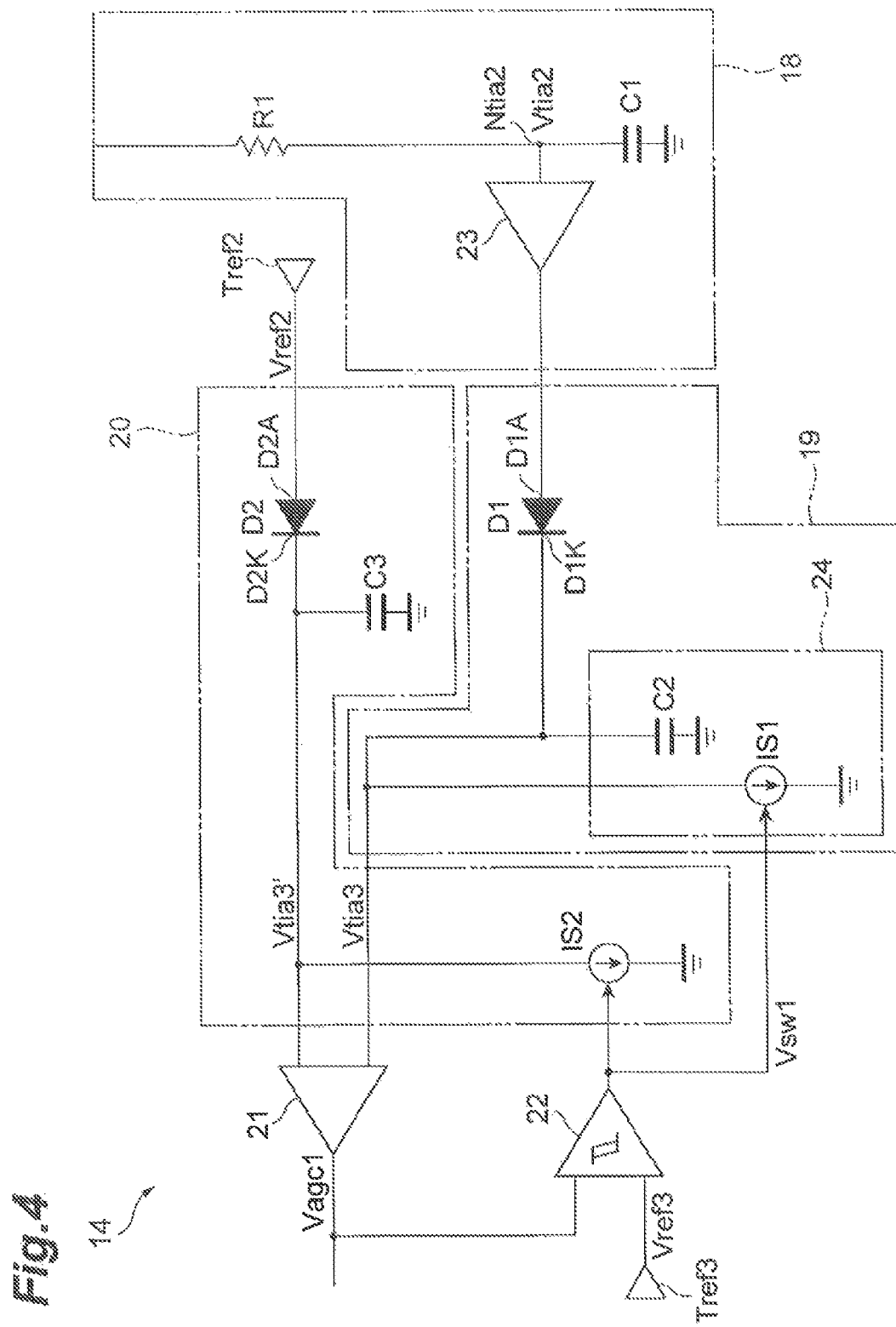
FIG. 4 is a circuit diagram illustrating a feedback circuit in FIG. 3.

The feedback circuit 14 automatically controls an amount of the bypass circuit 13 based on the output voltage Vtia1 output from the TIA core unit 11. Details of the feedback circuit 14 will be described with reference to FIG. 4 as well. FIG. 4 is a circuit diagram illustrating the feedback circuit 14 in FIG. 3.

As illustrated in FIG. 4, the feedback circuit 14 includes a filter 18, shifter 19 and 20 (first first shifter, second shifter), a comparator 21 (first comparator), and a hysteresis comparator 22 (second comparator).

Figure 6:
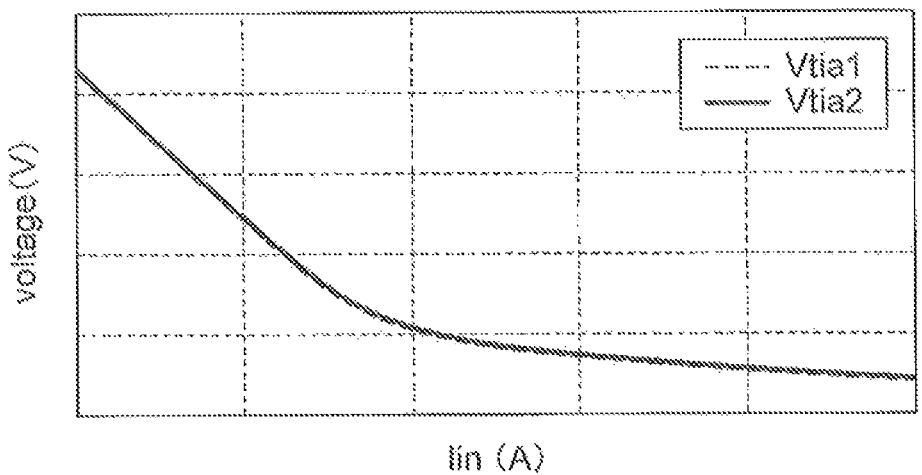
FIG. 6 is a diagram illustrating a relationship between an output voltage of a filter and an input current.

The filter 18 includes a series circuit of resistor R1 and capacitor C1, and a buffer 23. The filter 18 generates low frequency components of the output voltage Vtia1 output from the TIA core unit 11 and outputs them as an output voltage Vtia2 at a node between the resistor R1 and the capacitor C1. As illustrated in FIG. 6, as the input current Iin input to the input terminal Tin increases, the output voltage Vtia1 output from the TIA core unit 11 and the output voltage Vtia2 decreases. The ordinate in FIG. 6 is a DC voltage (time average of a voltage signal), and the output voltage Vtia1 and the output voltage Vtia2 substantially coincide with each other. However, in transient response, the output voltage Vtia2 changes with a delay according to a time constant (R1×C1) in contrast with a change of the output voltage Vtia1.

The resistor R1 is connected between the node Ntia1 and the buffer 23. The output voltage Vtia1 output from the TIA core unit 11 is input to one of two ends of the resistor R1. One of two ends of the capacitor C1 is connected with an input terminal of the buffer 23 and another of the two ends of the resistor R1. Another of the two end of the capacitor C1 is grounded. Electric charges are charged to the capacitor C1 according to the change of the output voltage Vtia1. The buffer 23 is connected with a node Ntia2 between the resistor R1 and the capacitor C1, and the output voltage Vtia2 is input to the buffer 23. The buffer 23 outputs an output voltage to the shifter 19 according to the output voltage Vtia2.

The shifter 19 includes a series circuit of a diode (first diode) D1 and a parallel circuit (first parallel circuit). The parallel circuit (first parallel circuit) includes a capacitor (first capacitor) C2, and a current source (first current source) IS1. A current flowing in the current source IS1 is changed according to the input signal input to the current source IS1. The output voltage of the buffer 23, is input to an anode D1A of the diode D1, namely an input terminal of the shifter 19. Also, a cathode D1K of the diode D1 is connected with a parallel circuit 24 including the capacitor C2 and the current source IS1. The cathode D1K of the diode D1 is connected with a positive input terminal "+" of the comparator 21. Also, one of two terminals of the parallel circuit 24 is connected to the cathode D1K of the diode D1, and the another of the two terminals of the parallel circuit 24 is grounded. The shifter 19 generates an output signal (output voltage) Vtia3 (first shift signal) based on the output voltage of the buffer 23, and outputs it to one input terminal of the comparator 21. That is, the shifter 19 outputs the output signal Vtia3 (first shift signal) which changes according to the output signal of the filter 18. Details of the output voltage Vtia3 will be described later.

The shifter 20 includes the same configuration as the shifter 19. That is, the shifter 20 includes a series circuit of a diode (second diode) D2 of the same electrical characteristic as the diode D1, and a parallel circuit (second parallel circuit). The parallel circuit (second parallel circuit) includes a capacitor (second capacitor) C3 of the same electrical characteristic as the capacitor C2; and a current source (second current source) IS2 of the same electrical characteristic as the current source IS1. An anode D2A of the diode D2 is connected to a reference voltage terminal Tref2. A reference signal (first threshold reference) Vref2 is applied to the reference voltage terminal Tref2. Also, a cathode D2K of the diode D2 is connected to one of two ends of a parallel circuit including the capacitor C3 and the current source IS2. The cathode D2K of the diode D2 is connected with a negative input terminal "−" of the comparator 21. Another of the two ends of the the parallel circuit is grounded. The shifter 20 generates an output signal (output voltage) Vtia3' (second shift signal) based on the reference voltage Vref2 input from the reference voltage terminal Tref2, and outputs it to the negative input terminal (not the input terminal to which the Vtia3 is input) of the comparator 21. That is, the shifter 20 outputs the output signal Vtia3' (second shift signal) which changes according to the reference voltage Vref2. The current sources IS1 and IS2 have a control terminal respectively, and increase a current flowing in the current source (ON state) when the voltage input there is larger than a predetermined value, and decrease the current (OFF state) when the voltage input is smaller than or equal to the predetermined value. For example, NPN type bipolar transistors may be used as the current sources IS1 and IS2. In that case, a base (terminal) becomes the control terminal, and a collector current IC is increased or decreased according to a base-emitter voltage VBE (the predetermined value in this case is generally 0.6 to 0.8 V).

The comparator 21 outputs the control signal Vagc1 (first control signal) by comparing the output signal (the output voltage Vtia3) of the shifters 19 with the output signal of the shifter 20 (the output voltage Vtia3'). The control signal Vagc1 controls the bypass circuit 13 (adjusts an amount of the bypass current Iagc). Specifically, the comparator 21 compares the output voltage Vtia3 with the output voltage Vtia3', and outputs the control signal Vagc1 determined by a result of the comparison to the bypass circuit 13 and the hysteresis comparator 22. Then, the bypass circuit 13 controls the bypass current based on the control signal Vagc1. Thus, by adjusting the threshold reference Vref2, as the value of the control signal Vagc1 to start a extracting the bypass current, the gain can be automatically controlled. Therefore, the reference Vref2 is a threshold reference (first threshold reference) that determines a start timing to extract the bypass current by the bypass circuit 13.

The hysteresis comparator 22 outputs an output signal (output voltage) Vsw1 (second control signal) for controlling respective time constants of the shifters 19 and 20 according to the control signal Vagc1 and a reference signal (second threshold reference) Vref3. Specifically, the hysteresis comparator 22 turns the output signal (output voltage) Vsw1 to a low level (LOW) or a high level (HIGH) by comparing the control signal Vagc1 with the reference (second threshold reference) Vref3, and controls the current sources IS1 and IS2. That is, the hysteresis comparator 22 decreases the respective currents flowing in the current sources IS1 and IS2 and stops the current sources IS1 and IS2 (OFF state) by setting the output voltage Vsw1 to LOW, and increases the respective currents flowing in the current sources IS1 and IS2 and operates the current sources IS1 and IS2 (ON state) by setting the output voltage Vsw1 to HIGH. Also, the hysteresis comparator 22 may control the current sources IS1 and IS2 by adjusting the respective currents flowing in the current sources IS1 and IS2. That is, instead of stopping the current sources IS1 and IS2, the output currents of the current sources IS1 and IS2 may be reduced in the ON state. Or, instead of operating the current sources IS1 and IS2, the currents flowing in the current sources IS1 and IS2 may be increased in the OFF state.

The hysteresis comparator 22 sets two different thresholds, that is, a first threshold and a second threshold larger than the first threshold, based on the reference Vref3 which is a second threshold reference applied to a reference terminal Tref3. The hysteresis comparator 22 defines one of the first threshold and the second threshold as a threshold according to the control signal Vagc1, and compares it with the control signal Vagc1.

Specifically, when the control signal Vagc1 starts to decrease from the voltage thereof higher than the first threshold, the hysteresis comparator 22 defines the first threshold as the threshold reference Vref3. Then, when the control signal Vagc becomes lower than the first threshold, the hysteresis comparator 22 turns the output voltage Vsw1

Figure 7:
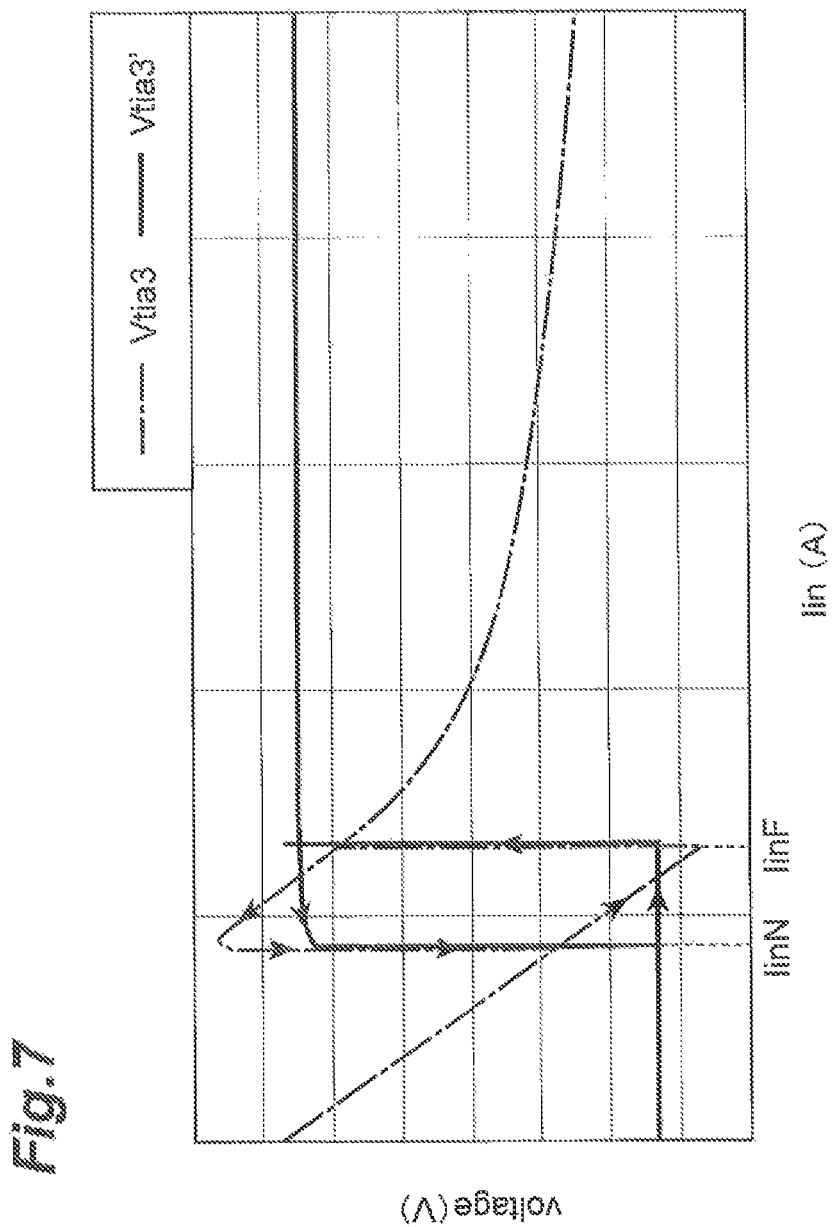
FIG. 7 is a diagram illustrating a relationship of respective output voltages of first and second shifters with the input current.
Figure 8:
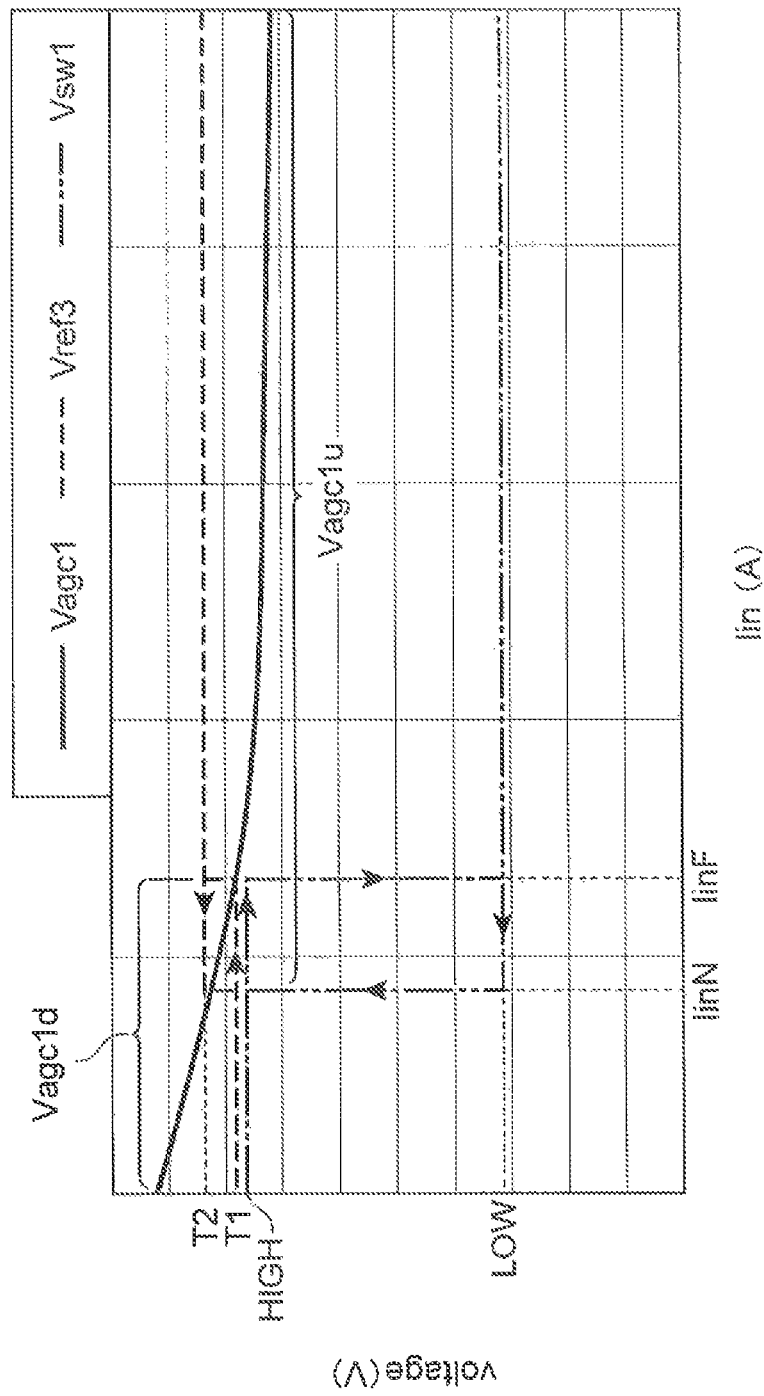
FIG. 8 is a diagram illustrating a relationship of respective output voltages of first and second comparators with the input current.

LOW, and stops the current sources IS1 and IS2 (OFF state). That is, as illustrated in FIG. 8, when the control signal Vagc1d decreasing from the voltage higher than a first threshold reference T1 becomes smaller than the first threshold T1 and the current input to the input terminal Tin becomes an input current IinF, the output voltage Vsw1 is turned LOW. Also, when the current input to the input terminal Tin becomes the input current IinF and the output voltage Vsw1 is turned LOW, since the current sources IS1 and IS2 are stopped (OFF state), as illustrated in FIG. 7, the output voltage Vtia3 and the output voltage Vtia3' become high.

On the other hand, the control signal Vagc1 starts to increase from the voltage thereof lower than the first threshold, the hysteresis comparator 22 defines the second threshold as the threshold reference Vref3. Then, when the control signal Vagc1 becomes higher than the second threshold, the hysteresis comparator 22 turns the output voltage Vsw1 HIGH, and operates the current sources IS1 and IS2 (ON state). That is, as illustrated in FIG. 8, when the control signal Vagc1u increasing from the voltage value lower than the first threshold T1 becomes higher than a second threshold T2 and the current input to the input terminal Tin becomes an input current IinN, the output voltage Vsw1 is turned HIGH. Also, when the current input to the input terminal Tin becomes the input current IinN and the output voltage Vsw1 is turned HIGH, the current sources IS and IS2 are activated. Therefore, as illustrated in FIG. 7, the output voltage Vtia3 and the output voltage Vtia3' become low.

In each of the case that the current source IS1 is operated and the case that it is stopped, a current flowing in the current source IS1 and a current flowing into the comparator 21 from the current source IS1 will be described. When the current source IS1 is operated, a current IS(ON) flows in the current source IS1, and a current Icomp(ON) flows into the comparator 21. At that time, the current IS(ON) is several dozens to several hundreds of the current Icomp(ON).

On the other hand, when the current source IS1 is stopped, a current IS(OFF) flows in the current source IS1, and a current Icomp(OFF) flows into the comparator 21. At that time, the current IS(OFF) is a negligible small, and is sufficiently small compared to the current Icomp(OFF). Also, the current Icomp(ON) when the current source IS1 is operated and the Icomp(OFF) when the current source IS1 is stopped have similar levels to one another. Also, even if they are several times different, by appropriately determining the IS(OFF) and IS(ON), a similar effect can be obtained.

Next, response time of the feedback circuit 14 will be described. The response time of the feedback circuit 14 is determined based on the time constant of the filter 18, or a discharge current of the feedback circuit 14.

In the shifter 19, when the output voltage Vtia2 decreases to a certain level, the current hardly flows to the diode D1, and the voltage of the capacitor C2 is turned to the output voltage of the shifter 19. A speed at which the output voltage decreases is determined by the discharge current from the capacitor C2. The discharge current from the capacitor C2 when the current source IS1 is operated becomes a sum of the current Icomp(ON) flowing into the comparator 21 and the current IS(ON) flowing in the current source IS1. As described above, since the current IS(ON) is several dozens to several hundreds of the current Icomp(ON), the discharge current from the capacitor C2 becomes large, and the output voltage decreases relatively quickly. Therefore, the response time is shortened. In this case, by setting the response time determined by the time constant of the filter 18 longer than the response time determined by the discharge current of the feedback circuit 14, the response time of the feedback circuit 14 is determined dominantly by the time constant of the filter 18.

On the other hand, the discharge current from the capacitor C2 when the current source IS1 is stopped becomes a sum of the current Icomp(OFF) flowing into the comparator 21 and the current IS(OFF) flowing in the current source IS1. As described above, since the current IS (OFF) is a vary small and negligible, it can be considered that the discharge current from the capacitor C2 is substantially the current Icomp(OFF) only. Therefore, the output voltage relatively slowly decreases. Thus, the response time is prolonged. In this case, by setting the response time determined by the discharge current of the feedback circuit 14 longer than the response time determined by the time constant of the filter 18, the response time of the feedback circuit 14 becomes the time based on the discharge current of the feedback circuit 14.

Figure 9:
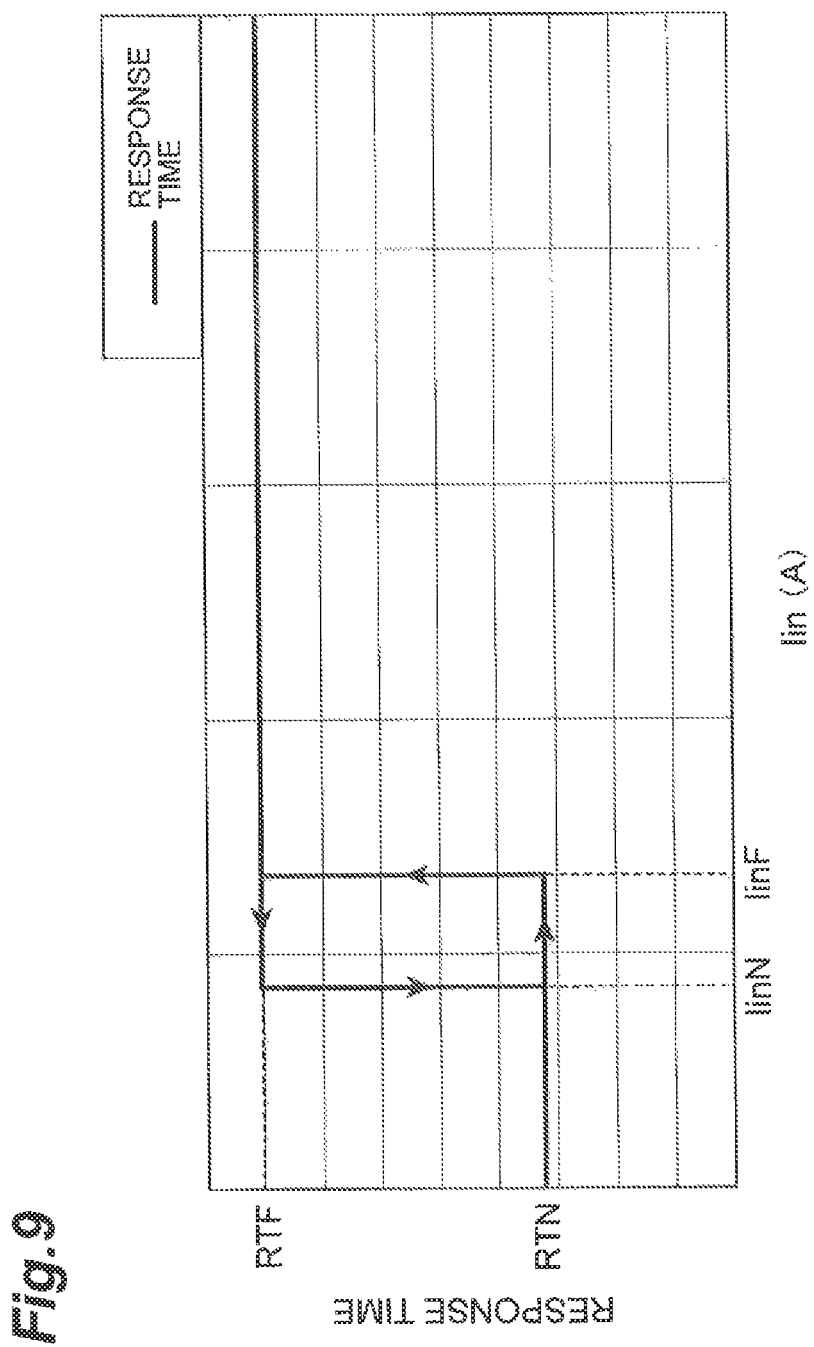
FIG. 9 is a diagram illustrating a relationship between response time with the input current.

Thus, the response time of the feedback circuit 14 is changed according to whether the current source IS1 is stopped (OFF state) or operated (ON state). That is, as illustrated in FIG. 9, when the current input to the input terminal Tin becomes the input current IinF and the current source IS1 is stopped, the response time becomes a response time RTF based on the discharge current flowing in the shifter 19. When the minute current IS(OFF) is neglected, capacitance of the capacitor C2 is defined as Cx, the current Icomp(OFF) is defined as Ix, and a voltage of the capacitor C2 is defined as Δvx, the response time RTF is obtained by a formula (1).

$$RTF = (Cx/Ix) \times \Delta Vx \quad (1)$$

On the other hand, as illustrated in FIG. 9, when the current input to the input terminal Tin becomes the input current IinN and the current source IS1 is operated, the response time becomes a response time RTN based on the time constant of the filter 18. Thus, when a resistance of the resistor R1 of the filter 18 is defined as Ry, the capacitance of the capacitor C1 is defined as Cy, and the time constant of the filter 18 is defined as τ, the response time RTN is obtained by a formula (2).

$$RTN = \tau = Ry \times Cy \quad (2)$$

Figure 5:
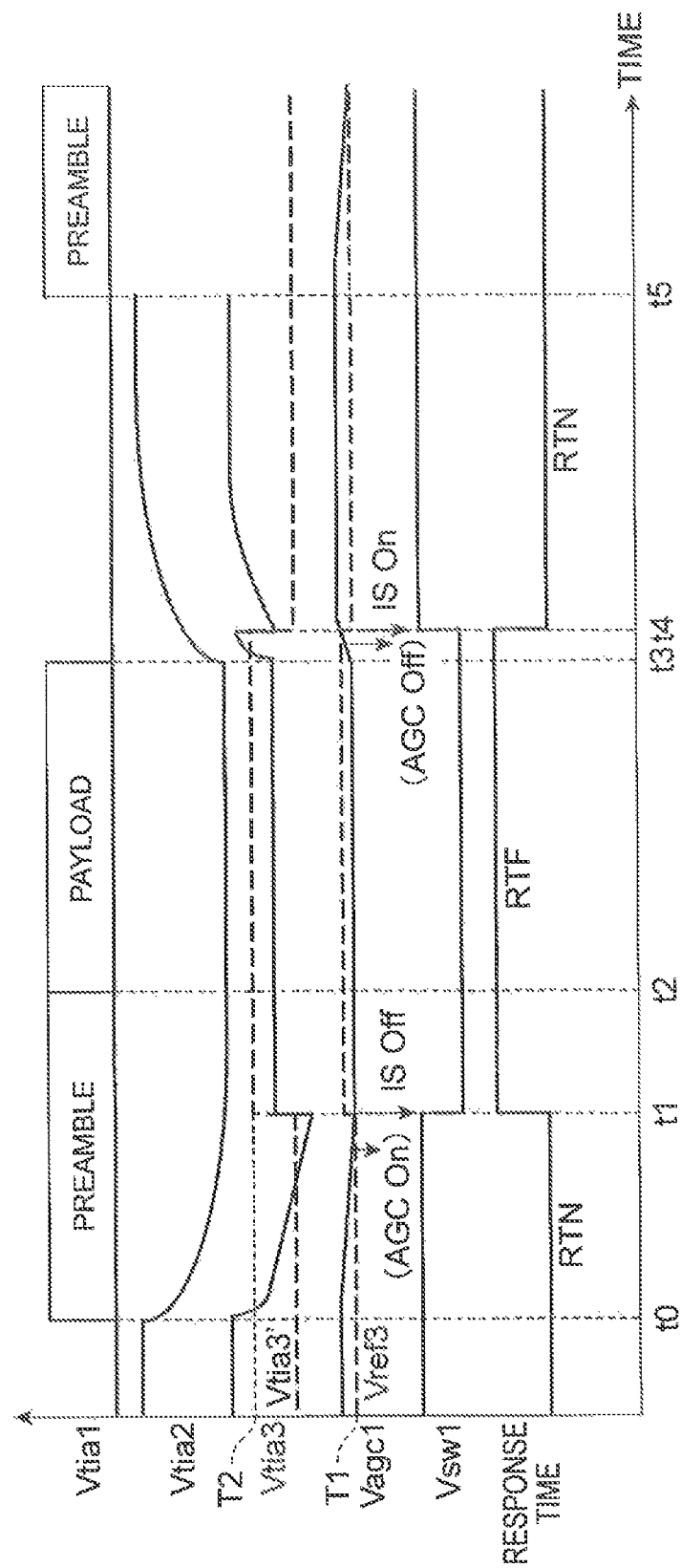
FIG. 5 is a timing chart illustrating waveforms of internal signals and a transition of a response time of the feedback circuit in FIG. 4.

Next, with reference to FIG. 5, transitions of internal signals of the feedback circuit will be described. FIG. 5 is a timing chart illustrating waveforms of the internal signals of the feedback circuit in FIG. 4. The respective waveforms indicate the output voltage Vtia1, the output voltage Vtia2, the output voltage Vtia3, the output voltage Vtia3', the control signal Vagc1, the reference Vref3, the control signal Vsw1, and the response time of the feedback circuit 14 in order from the top.

As illustrated in FIG. 5, input burst signals include a preamble part and a payload part. The preamble part includes a predetermined stream of signals input before the payload part is input. The payload part includes the true signals for transmitting and receiving data. While the preamble part is input to the reception unit, an internal state of the feedback circuit 14 is adjusted to an appropriate state by the above-described feedback operation. Thus, the control signal Vagc1 is stabilized and the output voltage is averaged.

Here, in a filter such as a low-pass filter, when the same data ("1" for example) continues in input signals or when a ratio of the same data increases, a level of the signals of the same data becomes closer to a center value (that is, a threshold that the signal changes from "1" to "0"). In this state, the "1" level is close to the center level and the amplitude of the signals from the center level to the "1" level decreases. Therefore, decision errors of two values "1" and "0" tend to occur on a reception unit side. When the time constant is small, since a low-cutoff frequency in the filter becomes high, vulnerability to the consecutive identical digit (CID) becomes more remarkable. On the other hand, when the time constant is large, that is, when the response time is long, since the time before the signal level gets close to the center level becomes long even when the same data (CID) continues, it becomes hard for the signal level to get close to the center level. Thus, in order to maintain tolerance against the CID, it is preferable that the response time is prolonged. Therefore, in a period of receiving the payload part including the signals for transmitting and receiving data (a period of the time t2-t3 in FIG. 5), it is preferable that the response time of the feedback circuit 14 is prolonged.

On the other hand, in an interval from an end of a burst signal to a start of another burst signal, there is a period during which the input signal becomes zero (no signal changes). In such a period, it is needed to stop the feedback circuit and return to a standby state so as to receive the next burst signal. Since a period before returning to the standby state does not contribute to the true communication in any way, it is preferable that the interval time is made as short as possible. In order to shorten the period after stopping the feedback circuit and before returning to the standby state (a period of the time t3-t5 in FIG. 5), it is needed to shorten the response time of the feedback circuit 14.

In the TIA 1 according to the present embodiment, the reference Vref2 and Vref3 are set so that the current sources IS1 and IS2 are operated and the bypass current is not extracted from the input current by the bypass circuit (AGC OFF) when no signal is received and the input current Iin is very small or substantially zero. Then, as illustrated in FIG. 5, when the preamble part start at the time t0, the output voltage Vtia2 and the output voltage Vtia3 start to decrease. Specifically, the output voltage Vtia2 decreases more slowly than the output voltage Vtia1, because a filter of the resistor R1 and the capacitor C1 passes only low frequency components of the output voltage Vtia1. Also, though a potential of the anode D1A of the diode D1 decreases, a potential of the cathode D1K does not rapidly decreases because of influence of the capacitor C2. Therefore, the output voltage Vtia3 decreases at a speed of discharging the electric charges of the capacitor C2 by the current flowing in the current source IS1. At a timing at which the output voltage Vtia3 decreases to a certain value, the control signal Vagc1 starts to decrease. Then, when the output voltage Vtia3 becomes smaller than the output voltage Vtia3', and further decreases to the certain value, the control signal Vagc1 becomes the value to start the current extraction, and the extraction of the current is started by the bypass circuit 13 (AGC ON).

Then, at a timing (the time t1) at which the output voltage Vtia3 further decreases and the control signal Vagc1 becomes smaller than the first threshold T1 based on the reference Vref3, the output voltage Vsw1 becomes LOW, and the current sources IS1 and IS2 are stopped (OFF state). The first threshold T1 based on the reference Vref3 is set such that at least the time t1 is before a timing (the time t2) of starting reception of the payload part. When the current sources IS1 and IS2 are stopped, the response time of the feedback circuit 14 becomes the response time RTF based on the discharge current that flows in the feedback circuit 14. Since the response time RTF depends on a speed of discharging the capacitor C2 by the minute current, it is relatively long. Also, when the current sources IS1 and IS2 are stopped, the output voltage Vtia3 and the output voltage Vtia3' become high. Also, the threshold based on the reference Vref3 is turned to the second threshold T2 higher than the first threshold T1.

The payload part starts at the time t2 and ends at the time t3. When the payload part ends the output voltage Vtia2 and the output voltage Vtia3 start to increase, and the control signal Vagc1 becomes high accordingly. Specifically, the output voltage Vtia2 becomes high by the time constant determined by the resistor R1 and the capacitor C1. Since charging by the diode D1 is at a sufficiently high speed, the output voltage Vtia3 also becomes high by the time constant of the resistor R1 and the capacitor C1. Then, when the control signal Vagc1 becomes large to a certain value, the current extraction is stopped (AGC OFF). Further, at a timing (the time t4) at which the control signal Vagc1 becomes higher than the second threshold based on the reference Vref3, the output voltage Vsw1 becomes HIGH, and the current sources IS1 and IS2 are operated (ON state). When the current sources IS1 and IS2 are operated, the response time of the feedback circuit 14 becomes the response time RTN based on the time constant τ of the filter 18. The response time RTN is the response time based on a resistance of the resistor R1 and the capacitance of the capacitor C1, and may be short compared to the response time RTF.

In this way, since the response time can be turned to the relatively long response time RTF in the period of the time t1-t4, the response time can be prolonged in the period of receiving the payloadpart, and the tolerance against the CID can be maintained. Also, since the response time can be turned to the relatively short response time RTN at the time t4 after the time t3 at which the payload part ends, the recovery time to the standby state after stopping the current extraction can be shortened.

Next, effects of the TIA 1 according to the present embodiment will be described.

In the TIA 1 according to the present embodiment, the comparator 21 outputs the control signal Vagc1 that controls the bypass circuit 13 from the output signal of the shifter 19, that is, the output voltage Vtia3, and the output signal of the shifter 20, that is, the output voltage Vtia3' based on the reference Vref2 which is the first threshold reference. Therefore, by setting the reference Vref2 so as to start the extraction of the current by the bypass circuit 13 when the output voltage Vtia3 of the shifter 19 becomes a predetermined value, for example, the extraction of the current is automatically started according to the output voltage Vtia3, and a time average of the current signal input to the TIA core unit 11 is controlled so as to be a predetermined value (Also, while the gain of the output voltage to the input current of the TIA core unit 11 changes depending on the time average of the current signal, this control may be performed with adjustment of the gain to a predetermined value as a target. In that case, this control is called automatic gain control (AGC: Auto Gain Control)).

Also, the hysteresis comparator 22 outputs the control signal (output voltage) Vsw1 for controlling the time constants of the shifters 19 and 20 by comparing the control signal Vagc1 output by the comparator 21 with the reference Vref3 which is the second threshold reference. Therefore, the response time of the feedback circuit 14 can be appropriately adjusted by the setting of the reference Vref3. Since the response time of the feedback circuit 14 can be adjusted independent of the values of the resistor and the capacitor, enlargement of the TIA 1 can be suppressed.

Also, in the TIA 1 according to the present embodiment, the shifter 19 includes a series circuit of the diode D1 and the parallel circuit 24. The parallel circuit 24 includes the capacitor C2 and the current source IS1 connected in parallel to the capacitor C2. Then, the anode D1A of the diode D1 is connected to the output of the filter 18. One of two ends of the parallel circuit 24 and the input of the comparator 21 are connected to the cathode D1K of the diode D1, and another of the two ends of the parallel circuit 24 is grounded. Also, the shifter 20 includes a series circuit of the diode D2 and another parallel circuit. The another parallel circuit includes the capacitor C3 and the current source IS2 connected in parallel to the capacitor C3. Then, the anode D2A of the diode D2 is connected to the reference voltage terminal Tref2. The input of the comparator 21 is connected to the cathode D2K of the diode D2, and another of the two ends in the parallel circuit is grounded. Then, the control signal (output voltage) Vsw1 is input to the current sources IS1 and IS2, and the respective currents flowing in the current sources IS1 and IS2 are increased or reduced according to the control signal (output voltage) Vsw1.

In this way, since the capacitor C2 is included in the shifter 19 and the capacitor C2 and the current source IS1 are connected in parallel to each other, the response time of the feedback circuit 14 can be appropriately adjusted utilizing the discharge current from the capacitor C2. Also, by setting the reference Vref3 so as to stop the operating current sources IS1 and IS2 or to operate the stopped current sources IS1 and IS2 by increasing or reducing the current flowing in the current sources IS1 and IS2 according to the control signal (output voltage) Vsw1, the operating state of the current sources IS1 and IS2 can be controlled according to the control signal Vagc1.

In the state that the current sources IS1 and IS2 are stopped (OFF state), the respective currents flowing therein decreases and the response time of the feedback circuit 14 becomes long compared to the state that the current sources IS1 and IS2 are operated (ON state). In this way, by switching the operating state of the current sources IS1 and IS2, the response time of the feedback circuit 14 can be appropriately adjusted. Then, since the response time of the feedback circuit 14 can be adjusted by switching an activation state of the current sources IS1 and IS2 independent of the values of the resistor and the capacitor, the enlargement of the TIA 1 can be suppressed. From the above, according to the present invention, miniaturization of the transimpedance amplifier can be realized while appropriately adjusting the response time of the feedback circuit 14.

Also, In the TIA 1 according to the present embodiment, when the output currents of the current sources IS1 and IS2 are increased (ON state) such as the case that the high level (HIGH) higher than the predetermined value is input to the current sources IS1 and IS2 by the hysteresis comparator 22 and they are operated, the current that flows flowing in the current source IS1 of the shifter 19 is larger than the current input from the shifter 19 to the comparator 21. On the other hand, when the output currents of the voltage sources IS1 and IS2 are reduced (OFF state) such as the case that the low level (LOW) smaller than or equal to the predetermined voltage is input to the current sources IS1 and IS2 by the hysteresis comparator 22 and they are stopped, the current flowing in the current source IS1 of the shifter 19 is smaller than the current input from the shifter 19 to the comparator 21.

Thus, the discharge current from the capacitor C2 can be increased and the response time of the feedback circuit 14 can be shortened in the state that the current source IS1 is activated, and the discharge current from the capacitor C2 can be reduced and the response time of the feedback circuit 14 can be prolonged in the state that the current source IS1 is stopped. That is, by switching the activation state of the current source IS1, the response time of the feedback circuit 14 can be appropriately adjusted.

Also, in The TIA 1 according to the present embodiment, in the hysteresis comparator 22, the first threshold T1 and the second threshold T2 larger than the first threshold T1, which are based on the reference voltage Vref3, are set. Then, when the control signal Vagc1 becomes lower than the first threshold T1, the current source IS1 is stopped or the like, and the current flowing in the current source IS1 is reduced to a very small value. Also, when the control signal Vagc1 increases from the state of being lower than the first threshold T1 and becomes higher than the second threshold T2, the current source IS1 is activated or the like, and the current flowing in the current source IS1 is increased. By setting the first threshold T1 and the second threshold T2 of different values as the thresholds based on the reference Vref3, frequent alternate transition between the respective states of increasing and reducing the current flowing in the current source IS1 can be suppressed. As a result, instability of such a circuit operation like an oscillation can be suppressed.

Figure 10:
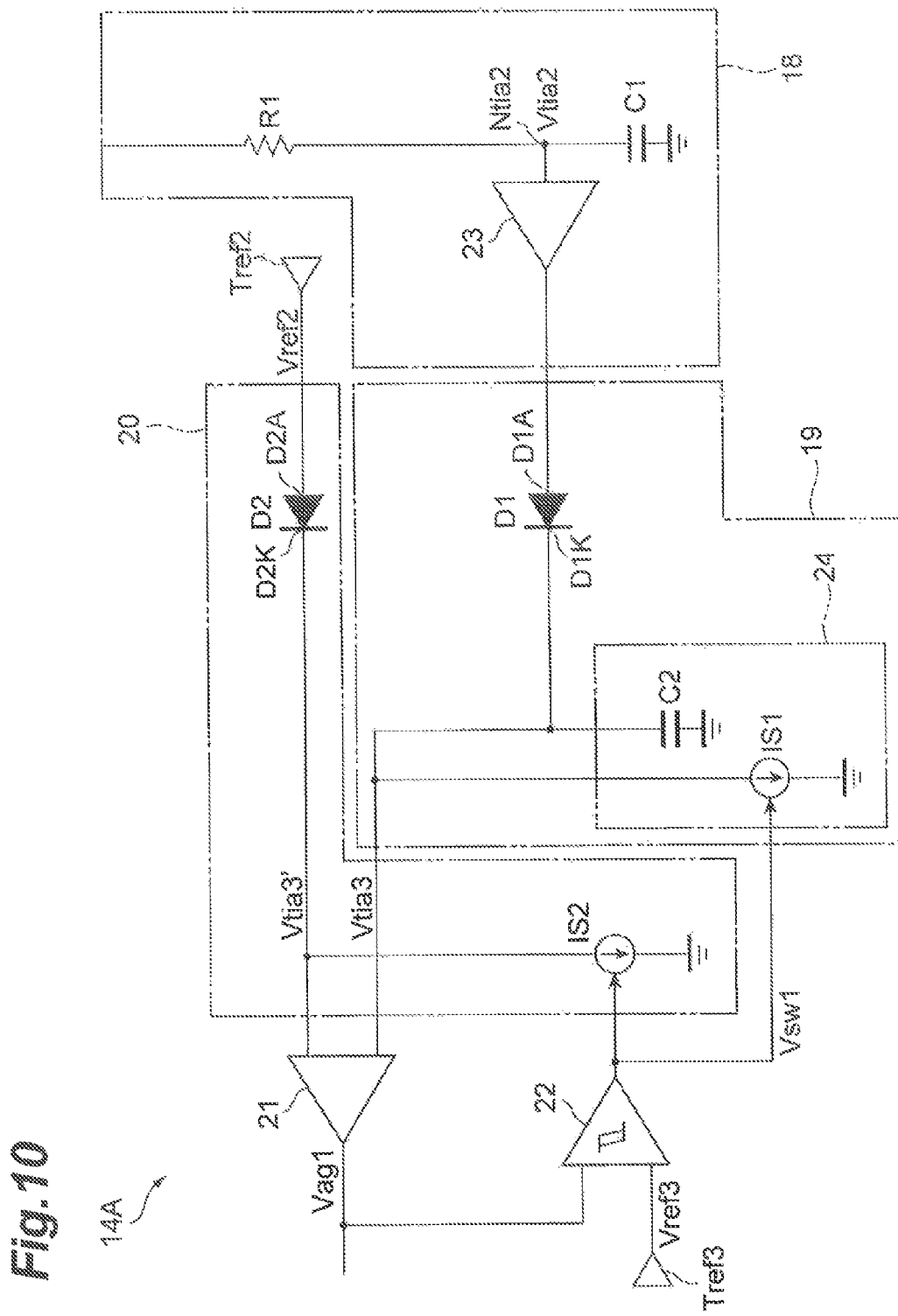
FIG. 10 is a circuit diagram illustrating the feedback circuit according to a modification of the embodiment.

The embodiment of the present invention has been described above, however, the present invention is not limited to the above-described embodiment. For example, it has been described that both of the shifter 19 and 20 include the capacitor, however, without being limited to that, a configuration may be such that the shifter 20 does not include the capacitor as in a feedback circuit 14A illustrated in FIG. 10.

Figure 11:
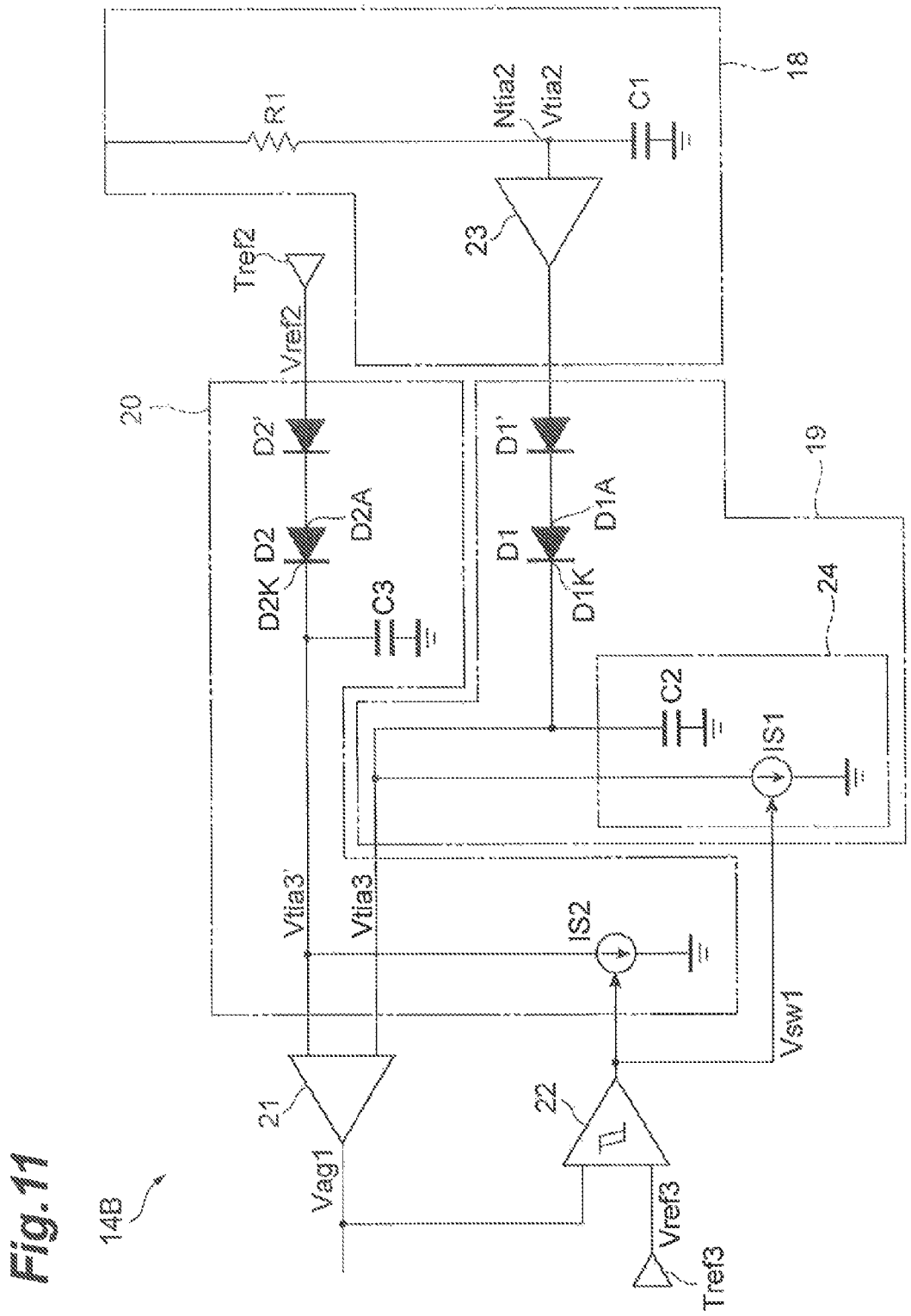
FIG. 11 is a circuit diagram illustrating the feedback circuit according to another modification of the embodiment.

Also, a configuration of the diode included in the shifter 19 is not limited either, and the diode may be configured by two diodes that are diodes D1 and D1' as in a feedback circuit 14B illustrated in FIG. 11 for example, or the number of steps may be larger. Also, the diode may be configured by diode connection of a bipolar transistor or diode connection of a MOS transistor. Also, in the case of turning the diode of the shifter 19 to the configuration by the two diodes D1 and D1', the diode of the shifter 20 may be also turned to the configuration by other two diodes D2 and D2', the electrical characteristic of the diode D2 may be the same as the electrical characteristic of the diode D1, and the electrical characteristic of the diode D2' may be the same as the electrical characteristic of the diode D1'.

Figure 12:
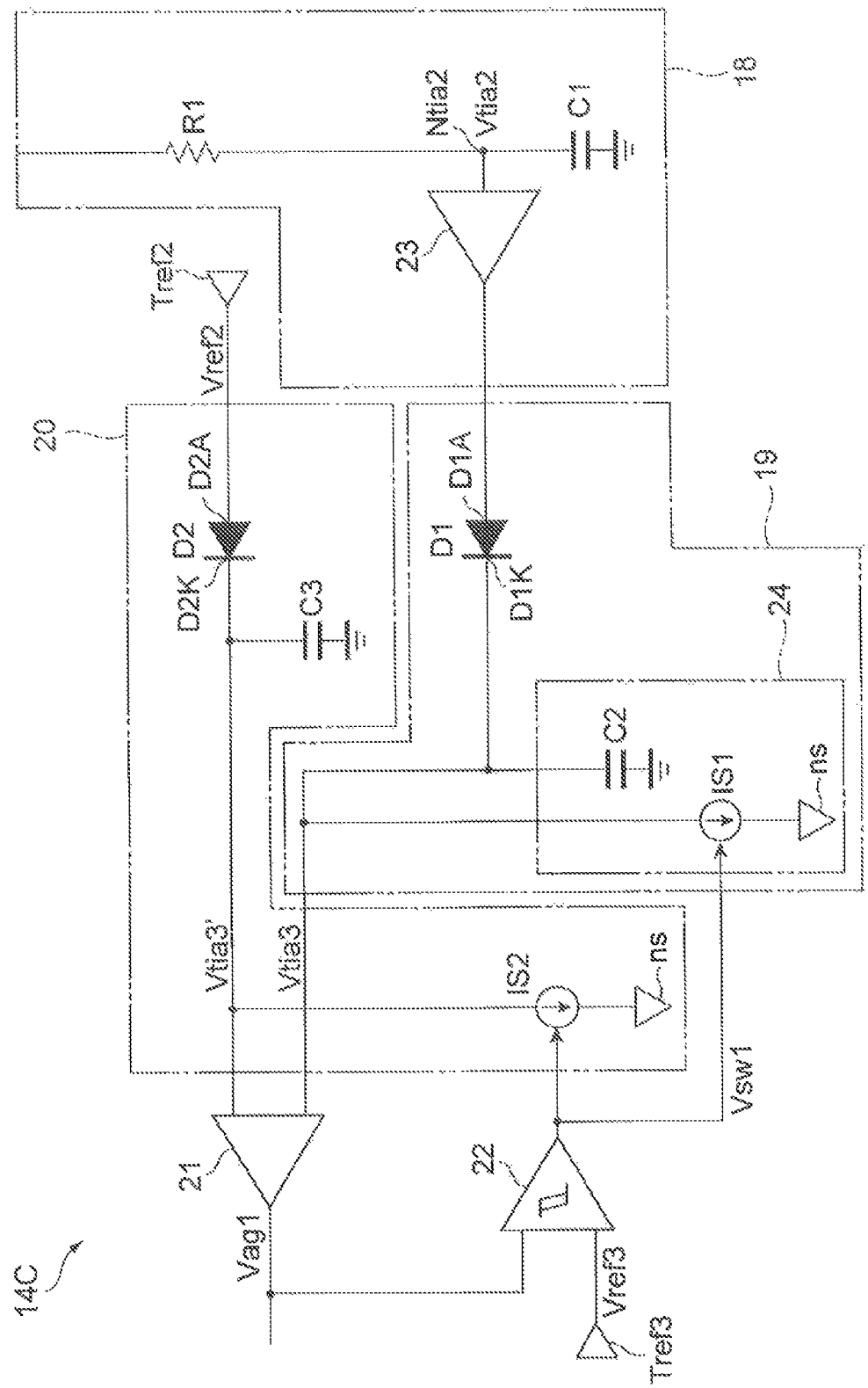
FIG. 12 is a circuit diagram illustrating the feedback circuit according to further another modification of the embodiment.

Also, it has been described that the current sources IS1 and IS2 are grounded in the shifter 19 and 20, however, without being limited thereto, for example, as in a feedback circuit 14C illustrated in FIG. 12, the current sources IS1 and IS2 may be connected to a negative power supply ns. By the configuration, a margin can be provided in an operation characteristic of the current sources IS1 and IS2 against fluctuation of a power supply voltage.

Also, the current sources IS1 and IS2 may not be independent from each other and may be, for example, configured by a current mirror circuit so that the current flowing in the current source IS2 is in proportional to the current flowing in the current source IS1. In that case, the output of the hysteresis comparator 22 may be connected only with a control terminal of the current source IS1 (for example, base of a bipolar transistor).

Also, it has been described that the first threshold and the second threshold are set by the hysteresis comparator 22, however, without using the hysteresis comparator, an activation operation state of the current source may be controlled by one threshold.

What is claimed is:

1. A transimpedance amplifier that converts an input current into an output voltage, the amplifier comprising:
  a core unit configured to convert a current signal to the output voltage;
  a bypass circuit configured to generate the current signal by extracting a bypass current from the input current; and
  a feedback circuit configured to adjust the bypass current based on the output voltage,
  wherein the feedback circuit includes:
  a filter configured to pass low frequency components of the output voltage,
  a first shifter configured to generate a first shift signal from the low frequency components with a time constant,
  a second shifter configured to generate a second shift signal from a first threshold reference with another time constant,
  a first comparator configured to control the bypass current by comparing the first shift signal with the second shift signal, and
  a second comparator configured to control the time constant and the another time constant by comparing an output of the first comparator with a second threshold reference,
  wherein the first shifter includes a series circuit of a first diode and a first parallel circuit, the first diode being between the filter and the first comparator, the first parallel circuit including a first capacitor and a first current source connected in parallel to the first capacitor, the first current source generating a discharging current for the first capacitor,
  wherein the second shifter includes a series circuit of a second diode and a second parallel circuit, the second diode being between the first threshold reference and the first comparator, the second parallel circuit including a second capacitor and a second current source connected in parallel to the second capacitor, the second current source generating another discharging current for the second capacitor,
  wherein the first comparator generates a first control signal to control the bypass circuit and the second comparator, and adjusts the bypass current by changing the first control signal, and
  wherein the second comparator generates a second signal to control the first current source and the second current source.

2. The transimpedance amplifier according to claim 1,
  wherein the time constant of the first shifter becomes shorter by increasing the discharging current of the first current source when the first control signal becomes higher than the second threshold reference, and
  wherein the time constant of the first shifter becomes longer by decreasing the discharging current of the first current source when the first control signal becomes lower than the second threshold reference.

3. The transimpedance amplifier according to claim 1,
  wherein the second threshold reference includes a first threshold and a second threshold, the first threshold being lower than the second threshold,
  wherein the time constant of the first shifter becomes shorter by increasing the discharging current of the first current source when the first controls signal becomes higher than the second threshold, and
  wherein the time constant of the first shifter becomes longer by decreasing the discharging current of the first current source when the first control signal becomes lower than the first threshold.

* * * * *